United States Patent [19]

Yu et al.

[11] Patent Number: 4,977,098

[45] Date of Patent: Dec. 11, 1990

[54] METHOD OF FORMING A SELF-ALIGNED BIPOLAR TRANSISTOR USING AMORPHOUS SILICON

[75] Inventors: Hyunkyu Yu; Sangwon Kang; Jinhyo Lee, all of Chungnam, Rep. of Korea

[73] Assignee: Korea Electronics & Communications Research Inst., Rep. of Korea

[21] Appl. No.: 370,885

[22] Filed: Jun. 23, 1989

[30] Foreign Application Priority Data

Sep. 7, 1988 [KR] Rep. of Korea .............. 88-11545[U]

[51] Int. Cl.⁵ .................. H01L 21/265; H01L 21/283
[52] U.S. Cl. ....................................... 437/31; 437/162; 437/192; 437/193; 437/200; 437/202; 437/247; 148/DIG. 1; 148/DIG. 147
[58] Field of Search ................... 437/31, 32, 162, 192, 437/193, 946, 200, 950, 202, 247, 189; 148/DIG. 1, DIG. 3, DIG. 19, DIG. 147; 357/59 I, 59 B

[56] References Cited

U.S. PATENT DOCUMENTS

| | | | |
|---|---|---|---|
| 3,640,811 | 2/1972 | Vossen, Jr. | 148/DIG. 17 |
| 4,042,953 | 8/1977 | Hall | 148/DIG. 147 |
| 4,106,051 | 8/1978 | Dormer et al. | 148/DIG. 147 |
| 4,128,670 | 12/1978 | Gaensslen | 148/DIG. 147 |
| 4,265,935 | 5/1981 | Hall | 148/DIG. 147 |
| 4,301,588 | 11/1981 | Horng et al. | 437/162 |
| 4,309,812 | 1/1982 | Horng et al. | |
| 4,488,166 | 12/1984 | Lehrer | 357/59 |
| 4,579,609 | 4/1986 | Reif et al. | 437/946 |
| 4,605,479 | 8/1986 | Faith, Jr. | 148/DIG. 17 |
| 4,679,310 | 7/1987 | Ramachandra et al. | 148/DIG. 147 |
| 4,777,150 | 10/1988 | Deneuville et al. | 437/192 |
| 4,904,620 | 2/1990 | Schmitz | 148/DIG. 147 |

FOREIGN PATENT DOCUMENTS 0068843 1/1983 European Pat. Off. ............ 437/200
0119548 5/1988 Japan ................................... 437/193
2172744 9/1986 United Kingdom .

OTHER PUBLICATIONS

Horng, "Self-Aligned Process for Providing an Improved High Performance Bipolar Transistor", U.S. Defensive Publication, No. T104,803, Nov. 6, 1984.

Primary Examiner—Brian E. Hearn
Assistant Examiner—Tuan Nguyen
Attorney, Agent, or Firm—Evenson, Wands, Edwards, Lenahan & McKeown

[57] ABSTRACT

A process for manufacturing a polysilicon-based bipolar semiconductor device, in particular an improved emitter contact configuration, eliminates native oxide anomalies at semiconductor interface regions, thus improving the characteristics of the emitter and its associated contact. Unwanted oxide is sputtered off the surface of a silicon substrate, so as to provide an effectively clean substrate surface. Next, a first amorphous silicon layer is formed on the surface of the substrate. Dopants are then implanted into the first amorphous silicon layer, to provide a source of diffusion impurities for forming an underlying (emitter) region. The resulting structure is then subjected to a rapid anneal which causes the impurities within the first amorphous silicon layer to diffuse into the substrate, forming the emitter region. Unwanted oxide that has been formed on the surface of the first amorphous silicon layer during the diffusion step is removed by sputtering. A titanium film and an overlying second amorphous silicon layer (ion-implanted with impurities) are formed atop the first amorphous silicon layer and the resulting structure is subjected to a further rapid anneal, so as to form a titanium-silicide layer that is intermediate and contiguous with the first and second amorphous layers.

6 Claims, 2 Drawing Sheets

METHOD OF FORMING A SELF-ALIGNED BIPOLAR TRANSISTOR USING AMORPHOUS SILICON

FIELD OF THE INVENTION

The present invention relates in general to the manufacture of semiconductor devices and, in particular, to a self-aligned bipolar transistor employing amorphous silicon for emitter formation.

BACKGROUND OF THE INVENTION

Although bipolar semiconductor devices have a lower integration density and higher manufacturing costs than MOS devices, bipolar integrated circuits are employed in a variety of high speed signal processing applications because of their relatively small propagation delay. With the development of polysilicon manufacturing techniques (sometimes referred to as PSA), the development of bipolar technology as seen an increase in integration density. However, in a conventional polysilicon process, the resulting physical/electronic properties of the bipolar device may vary widely from device-to-device and from run-to-run, so that the yield is not predictable and, moreover, the integration density is often reduced.

FIG. 1 shows a cross sectional illustration of an NPN bipolar transistor that is manufactured in accordance with a conventional polysilicon manufacturing process. Specifically, on the surface of a P-type silicon substrate 101, an N-type conductivity layer 102, which is to serve as the collector of the transistor, is epitaxially formed. A P-type extrinsic base region 103 and a P-type intrinsic base region 104 are formed in the epitaxial collector layer 102. In the upper surface of the intrinsic P-type base region 104, an N+type emitter region 105 is formed. Surrounding the extrinsic base region 103 is an isolating dielectric (oxide) 106. Contact with the extrinsic P-type base region 103 is derived by way of a P doped polysilicon layer 107 formed atop the extrinsic base region 103 and the isolating oxide layer 106. A polysilicon oxide film 108 is formed atop the P-type polysilicon layer 107, exposing the upper surface of the emitter region 105. Formation of an ohmic contact with the emitter region 105 at the surface of base region 104 is effected by way an N. doped polysilicon layer 109, which is contiguous with the polysilicon oxide film 108 and the top surface of the emitter region 105 in the upper portion of base layer 104.

In a polysilicon-processed bipolar transistor as shown in FIG. 1, one of the most important considerations is the control of the relatively shallow junction depth (on the order of 0.1 $\mu$m–0.2 $\mu$m) of the junction formed between the emitter region 105 and base region 104. Through the use of the polysilicon layer 109, it is possible to form a very shallow emitter region, which not only reduces the depth of the base emitter junction, but significantly reduces the junction capacitance. In addition, inter-electrode separation is reduced while, at the same time, resistance is decreased, thereby significantly lowering the RC time constant of the junction and thereby enhancing the speed of operation of the resulting bipolar transistor.

In the course of vapor deposition of the polysilicon layer, there is an unequal growth of oxide of 15–20Å thickness from the surface of the silicon, which cannot be removed due to the previous exposure of the boundary surface of the silicon substrate and the polysilicon layer. Consequently, the polysilicon process suffers from a number of defects including an increase in resistance of the emitter contact and the concentration of current flow at the emitter contact which, in turn, degrades the transconductance associated with the partial breakdown of the oxide caused by the current flow. In order to reduce this degradation problem, the emitter contact resistance should be decreased to a low a value as possible. There is a need, therefore, of a mechanism for reducing the emitter contact resistance in order that the emitter area itself can be reduced and thereby the integration density enhanced.

FIG. 2 is an enlarged view of the boundary surface region 110 between the polysilicon layer 109 and the emitter region within the surface portion of the substrate shown in FIG. 1. Specifically, FIG. 2 illustrates the P-type intrinsic base region 104, the N+emitter 105, polysilicon layer 109 doped with an N-type impurity (e.g. arsenic) and a native oxide region 111. Grain boundaries within the polysilicon layer 109 are shown at 112 while a breakdown region in portions of the native oxide 111 due to arsenic diffusion are shown at 113. A further degradation in the native oxide 111 is shown at 114, resulting from the flow of emitter current therethrough. As shown in FIG. 2, the thickness of the native oxide layer 111 is not only uneven, but it is punctuated by anomalies 113 and 114 resulting from dopant (e.g. arsenic) diffusion and current flow. Consequently,, across the surface of emitter region 105 at the boundary with the overlying polysilicon layer 109 there is a substantial variation in the emitter contact resistance.

Conventional efforts to obviate the above described defects at the boundary surface between the polysilicon layer and the emitter contact region have involved two approaches. In the first instance, in order to reduce the resistance of the emitter contact, high temperature anneal (on the order of 1150° C.) and high density (greater than $10^{21}$ cm$^{-3}$) surface treatment for the purpose of removing the uneven oxide layer have been proposed. With this approach, the thin surface oxide layer 111 was caused to effectively disintegrate. This was followed by recrystallizing the surface for the polysilicon contact which effectively causes the emitter to spread over a distance equal to the thickness of the polysilicon.

In accordance with the second approach, a chemical oxide or silicon nitride layer is grown to a thickness of 20–30Å as a substitute for the defective oxide.

Although the first approach (destruction of the oxide layer through high temperature anneal and high density bombardment) is capable of reducing the emitter contact resistance, it suffers from crystallization defects which lead to high impurity density and variation in junction depth due to the high temperature treatment. In addition, during the process, silicon carbide is formed at the boundary surface, which effectively prevents a further decrease in resistance. In the second approach, of forming the substitute, or replacement, dielectric for the defective oxide portions prevents an effective reduction in contact area and thereby prevents an increase in integration density.

SUMMARY OF THE INVENTION

In accordance with the present invention there is provided a new and improved process for manufacturing a polysilicon-based bipolar semiconductor device, in particular one having an improved emitter and associated contact configuration, which is capable of providing a shallow emitter junction, enjoys reduced emitter contact resistance and provides higher integration density. For this purpose, the present invention involves a manufacturing process which eliminates the problem of native oxide anomalies at semiconductor boundary or interface regions, the presence of which would otherwise detrimentally impact circuit characteristics.

In accordance with the inventive process unwanted material (oxide) is removed from the surface of a silicon substrate by sputtering, so as to provide an effectively clean substrate surface. Next, a first amorphous semiconductor layer is formed on the surface of the silicon substrate. Dopant impurities are then implanted into the first amorphous silicon layer, to provide a source of diffusion impurities for forming an underlying (emitter) region The resulting structure is then subjected to a rapid anneal which causes the impurities within the first amorphous silicon layer to diffuse into the substrate, forming the emitter region. Unwanted oxide that has been formed on the surface of the first amorphous silicon layer during the diffusion step is removed by sputtering A metallic (e.g. titanium) film and an overlying second amorphous silicon layer (ion-implanted with impurities) are formed atop the first amorphous silicon layer and the resulting structure is subjected to a further rapid anneal, so as to form a titanium-silicide layer that is intermediate and contiguous with the first and second amorphous layer. In a preferred embodiment of the invention, the first amorphous silicon layer has a thickness on the order of 2000-2500 angstroms, the titanium has a thickness on the order of 500 angstroms and said second amorphous silicon layer has a thickness on order of 300 angstroms.

DETAILED DESCRIPTION

Figure 1:
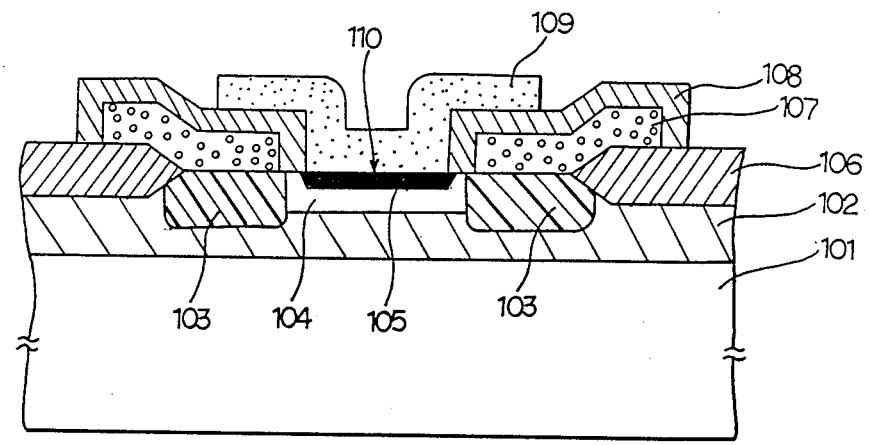
FIG. 1 shows a cross-sectional illustration of an NPN bipolar transistor that is manufactured in accordance with a conventional polysilicon manufacturing process.

The present invention will now be described with reference to FIGS. 3(a)-3(h) which diagrammatically show cross-sections of a semiconductor structure in the course of formation of an N+ type emitter for a bipolar transistor. It should be observed that the description to follow will focus only upon the manner of emitter formation. The remainder of the semiconductor structure is effectively the same as that shown in FIG. 1 and is conventional. Also, it is to be understood that the polarity of the device (NPN) is an illustrative example and not limitative of the invention. The formation of a PNP device is also contemplated with an appropriate change in conductivity types of dopant impurities.

Figure 3:
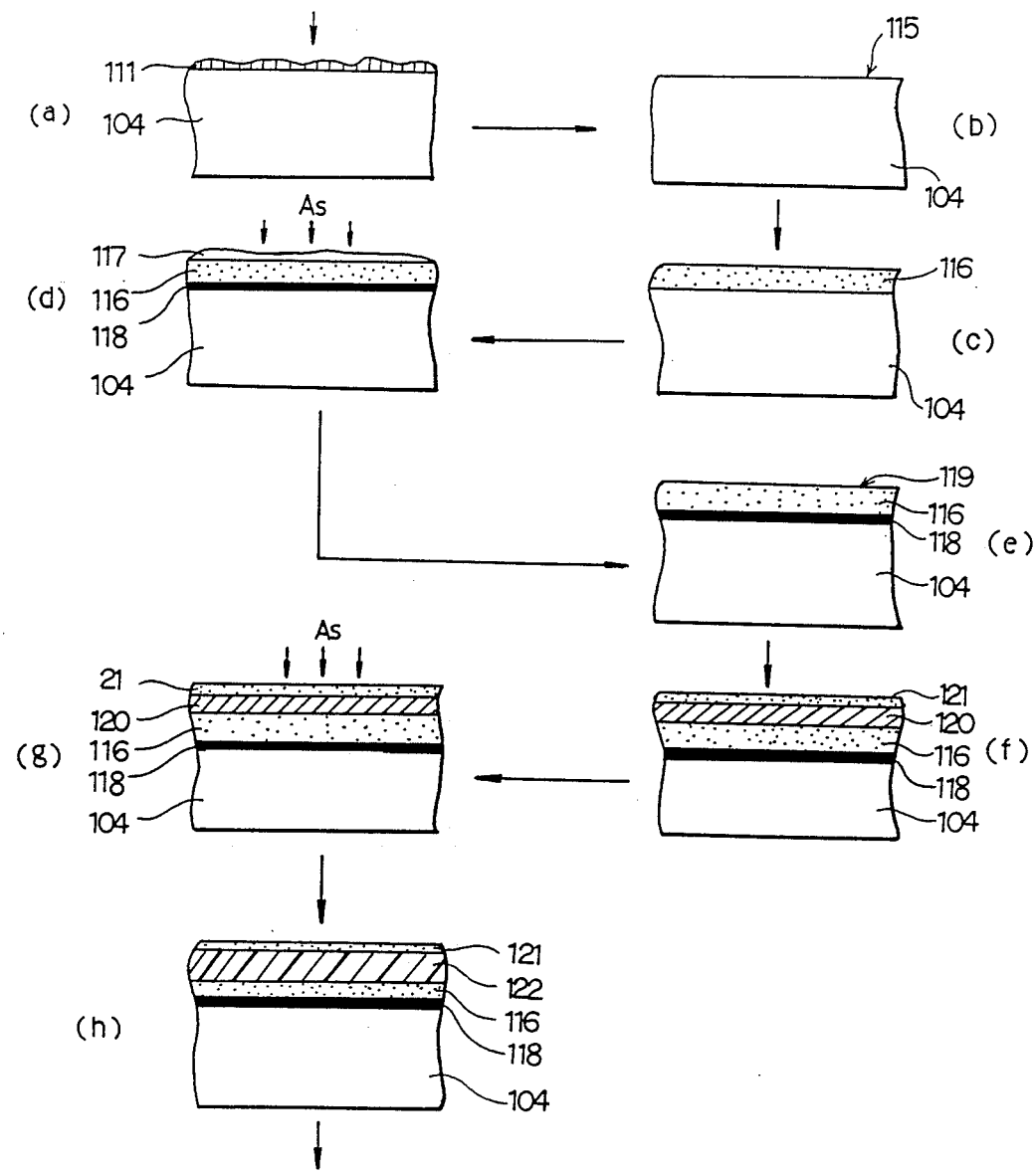
FIGS. 3(a)-3(h) diagrammatically show cross-sections of a semiconductor structure in the course of formation of an N+ type emitter for a bipolar transistor, in accordance with the manufacturing process of the present invention.

FIG. 3(a) shows a surface portion of the P-type intrinsic base portion 104 at the surface of the substrate just prior to forming the emitter region therein. As in the case of a conventional intrinsic emitter region, there is a thin uneven layer of native oxide 111 formed on the surface resulting from its exposure to the ambient air.

The first step in the process involves placing the wafer in a sputtering chamber and reducing the pressure to a value on the order of $10^{-7}$ at room temperature. For an NPN transistor, the atmosphere of the sputtering device consists of argon gas (purity on the order of 99.999%). Using an acceleration voltage on the order of 1,000 volts, the unwanted oxide is sputtered off the surface of the intrinsic base layer 104 for a period of from 30 to 40 seconds, so as to leave an effectively clean surface 115, shown in FIG. 3(b). It should be noted that if the acceleration voltage exceeds the 1,000 volt value, surface damage resulting from the impact of the argon ions in the sputtering ambient is not easily recoverable in the course of subsequent thermal annealing at a temperature on the order of 850° C. The anneal treatment itself is not performed immediately after sputter removal of the oxide layer, but is carried out for subsequent silicide and emitter formation).

Following the removable of the native oxide layer 111 a moderately thick layer 116 of amorphous silicon is deposited on the oxide-purged surface 115 of base region 104 as shown in FIG. 3(c). At a high vacuum and a vaporization temperature on the order 550°-750° C., a layer of amorphous silicon is deposited at a growth rate of 5-10Å per second, until the thickness of the amorphous silicon layer 116 reaches a thickness on the order of a 2,000-2,500Å. This layer of amorphous silicon will subsequently serve as a source of impurities for the formation of the emitter region.

After the layer of amorphous silicon 116 has been formed atop the intrinsic base region 104, an emitter dopant impurity (e.g. arsenic) is implanted into the amorphous layer 116, as shown diagrammatically in FIG. 3(d). In accordance with the exemplary embodiment, the implanter is set at an implanting energy of 150 KeV to provide a dosage rate of $1 \times 10^{20}$ cm$^{-3}$, so as to convert the amorphous layer 116 to N type of amorphous silicon. The arsenic impurities which have been implanted into an amorphous layer 116 are then defused into the surface of the P-type intrinsic base region 104 by introducing an argon gas ambient into the processing chamber and ramping the temperature up to 1,100°-1,250° C. for a period of 10 to 20 seconds, which causes out-diffusion of the implanted arsenic from the amorphous layer 116 into the surface of the base region 104 to form a shallow N type emitter region 118 Because of the high temperature of the out-diffusion process, there is a rapid thermal anneal of the surface into which the arsenic ions are diffused. During this diffusion process, an uneven native oxide layer 117 is formed atop the arsenic-doped amorphous layer 116.

Following the rapid anneal during which arsenic out diffuses from the doped amorphous layer 116 into the surface of the base region and anneals out the surface damage resulting from the argon sputtering step for removal of the native oxide layer 111, the semiconductor structure shown in FIG. 3(d) is subjected to another native oxide removal step for removing oxide layer 117, so as to obtain a clean top surface 119 of amorphous layer 116 as shown in FIG. 3(e). For this purpose, the same argon sputtering process described above in connection with the removal of the native oxide 111 is carried out Removal of the native oxide layer 117 serves to reduce the sheet resistance for the emitter contact.

Following removal of the native oxide layer 117, a high conductivity metallic film (e.g. titanium) 120 and a second amorphous layer 121 are formed atop the cleaned surface 119 of amorphous layer 116 as shown in FIG. 3(f). For this purpose, a titanium film 120 is deposited to a thickness on the order of 500Å. The second amorphous layer 121 is deposited to a thickness on the order of 300Å. The reasons for the formation of the titanium film and the second amorphous silicon film are as follows.

The sheet resistance is significantly increased with reduction in line width due to the high integration density, since the resulting semiconductor structure uses polysilicon for the conductive lines. If the doping density of the polysilicon is extremely high, the problem can be slightly improved; however, as the impurity concentration increases above values of $10^{21}$ cm$^{-3}$, the conductivity dopant effectively saturates the polysilicon, which causes precipitation between dopants to occur. Consequently, further increases in sheet resistance are not obtainable. Practically speaking, a reduction in the sheet resistance of polysilicon to values less than 50 ohms per square is extremely difficult to obtain.

On the other hand, by a change in materials for the conductive lines, specifically to titanium silicide, the sheet resistance can be reduced to a value on the order of 2-7 ohms per square, which is a reduction on an order of magnitude from that using doped polysilicon. If the thickness of the titanium is increased (namely greater than 500Å), the resistance is further decreased. However, there is a practical upper limit to the thickness of the titanium layer 120 and the overlying amorphous silicon layer 121, because the resulting topology has a substantially undesirable step coverage. Consequently, it is preferred that the thickness of the titanium layer be on the order of 500Å.

The second amorphous silicon film 121 is thick enough (300 angstroms) to prevent dopants in the emitter or the first amorphous layer 116 from being out diffused into the atmosphere during subsequent thermal annealing of the device.

FIG. 3(g) shows a step similar to that shown in FIG. 3(d) wherein arsenic is ion-implanted into the surface of the second amorphous layer 121. During this processing step, the implant energy is maintained at a value on the order of 88-100 KeV to provide a dosage rate of $1 \times 10^{20}$ cm$^{-3}$. Thereafter, as shown in FIG. 3(h), the semiconductor structure is annealed at a temperature of 700° C. for a period of time on the order of 20-30 seconds, in order to convert the titanium film 120 into a layer of titanium silicide. During this heat treatment, some of the arsenic within the doped amorphous silicon layer 116 will diffuse up into the titanium silicide layer. However, since the second amorphous silicon layer 121 has been formed atop the titanium film 120, a more stable titanium silicide layer 122 results because of the presence of silicon.

It should be noted that in the course of the formation of the second amorphous silicon layer 121, the implantation of arsenic into the second layer can be omitted or included as desired for the purpose of controlling the junction depth and impurity concentration of the emitter region 118. Thus, by varying process parameters, such as temperature and dose quantity, and thereby controlling the characteristics of the second amorphous layer, the properties of the emitter layer can be adjusted.

It should also be noted that the degree to which arsenic is formed in each of the amorphous silicon layers 116 and 121 can be used to adjust the characteristic of the titanium silicide (based upon the solubility of arsenic in titanium silicide and the degree of diffusion of the arsenic into the silicide and into the surface of the base region to form the emitter).

Figure 2:
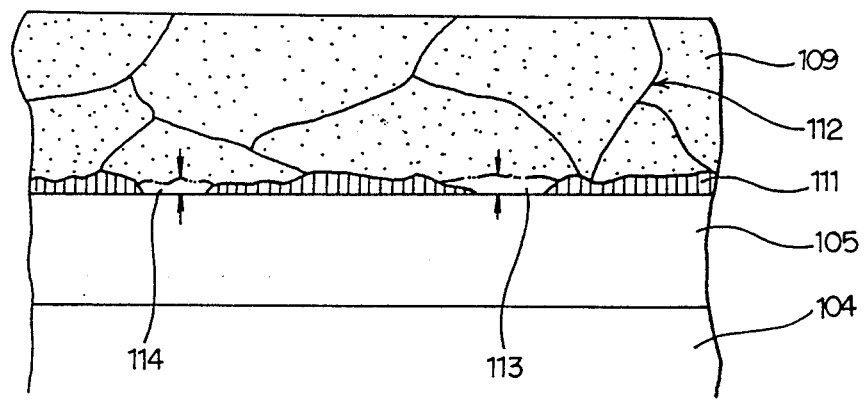
FIG. 2 is an enlarged view of the boundary surface region between the polysilicon layer and the emitter region within the surface portion of the substrate shown in FIG. 1.

The resulting emitter structure shown in FIG. 3(h) is free from the surface boundary defects shown in FIG. 2, discussed above, and includes a contact structure comprised of the dual amorphous silicon layers 116 and 121 and the intermediate titanium silicide layer 122. Typical thickness values for the resulting structure are 1,000-1,500Å for the amorphous silicon layer 116, 1,700Å for the titanium silicide layer 122, and 100Å for the second amorphous silicon layer 121.

As will be appreciated from the foregoing description, the present invention provides a new and improved process for manufacturing a polysilicon-based bipolar semiconductor device, in particular one having an improved emitter and associated contact configuration, which is capable of providing a shallow emitter junction, enjoys reduced emitter contact resistance and provides higher integration density.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of manufacturing a semiconductor device comprising the steps of:
    (a) removing unwanted material from the surface of a semiconductor substrate of a first conductivity type;
    (b) forming a first amorphous semiconductor layer doped with impurities of a second conductivity type on said surface of said semiconductor substrate;
    (c) heating the structure resulting from step (b), thereby diffusing impurities within said first amorphous semiconductor layer into said substrate, so as to form therein a semiconductor region of said second conductivity type;
    (d) removing unwanted material from the surface of said first amorphous semiconductor layer that has been formed thereon during step (c);
    (e) forming a metallic film and an overlying second amorphous semiconductor layer doped with impurities of said second conductivity type on said surface of said first amorphous semiconductor layer; and
    (f) forming a laminate structure of said first amorphous layer, a metallic-semiconductor compound and said second amorphous layer, by heating the structure resulting from step (e), so as to cause semiconductor material of said first and second amorphous layers to combine with said metallic film and convert said metallic film to said metallic-semiconductor compound adjoining said first and second amorphous layers.

2. A method according to claim 1, wherein step (e) comprises
    (e1) forming a metallic film on the surface of said first amorphous silcon layer,
    (e2) forming a second amorphous silicon layer on said metallic film, and
    (e3) introducing impurities of said second conductivity type into said second amorphous silicon layer, thereby doping said second amorphous silicon layer to said second conductivity type.

3. A method according to claim 2, wherein said metallic film comprises a titanium film having a thickness on the order of 500 angstroms and said second amorphous silicon layer has a thickness on the order of 300 angstroms.

4. A method according to claim 2, wherein step (e3) comprises implanting arsenic ions into said second amorphous silicon layer at an implant energy on the order of 80-100 KeV and a dosage rate of $1 \times 10^{20}$ cm$^{-3}$.

5. A method according to claim 1, wherein steps (b) and (e) respectively comprise implanting ions of said second conductivity type into said first and second amorphous semiconductor layers.

6. A method according to claim 1, wherein step (b) comprises implanting arsenic ions into said first amorphous silicon layer at an implant energy on the order of 150 KeV and a dosage rate of $1 \times 10^{20}$ cm$^{-3}$, and wherein step (c) comprises heating the structure resulting from step (b) in an argon atmosphere at a temperature in a range of 1100°-1150° C. for a period of time on the order of 10-20 seconds.

* * * * *